United States Patent
Pop (10) Patent No.: US 8,860,004 B2
(45) Date of Patent: Oct. 14, 2014

(54) STATE CHANGING DEVICE

(71) Applicant: The Board of Trustees of the University Illinois, Urbana, IL (US)

(72) Inventor: Eric Pop, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/057,377

(22) Filed: Oct. 18, 2013

(65) Prior Publication Data

US 2014/0042381 A1    Feb. 13, 2014

Related U.S. Application Data

(63) Continuation of application No. 12/463,953, filed on May 11, 2009, now Pat. No. 8,586,961.

(51) Int. Cl.
| | |
|---|---|
| H01L 29/06 | (2006.01) |
| G11C 13/02 | (2006.01) |
| H01L 45/00 | (2006.01) |
| B82Y 10/00 | (2011.01) |
| H01L 27/24 | (2006.01) |
| G11C 13/00 | (2006.01) |

(52) U.S. Cl.
CPC .......... *H01L 45/1273* (2013.01); *G11C 13/025* (2013.01); *H01L 45/1625* (2013.01); *H01L 45/1226* (2013.01); *H01L 45/144* (2013.01); *H01L 45/1675* (2013.01); *H01L 45/1233* (2013.01); *B82Y 10/00* (2013.01); *H01L 27/2463* (2013.01); *H01L 45/126* (2013.01); *H01L 45/06* (2013.01); *G11C 13/0004* (2013.01); *H01L 27/2472* (2013.01)

USPC .......................................... 257/5; 257/E29.003

(58) Field of Classification Search
None
See application file for complete search history.

(56) References Cited

U.S. PATENT DOCUMENTS

| | | | |
|---|---|---|---|
| 5,668,766 | A | 9/1997 | Bramnik |
| 6,574,130 | B2 | 6/2003 | Segal |
| 2003/0030519 | A1 | 2/2003 | Wyeth |
| 2007/0120095 | A1 | 5/2007 | Gruner |
| 2007/0158697 | A1 | 7/2007 | Choi |
| 2007/0233761 | A1 | 10/2007 | Mouttet |
| 2008/0224358 | A1 | 9/2008 | Rogers |
| 2008/0260941 | A1 | 10/2008 | Jin |
| 2009/0107834 | A1 | 4/2009 | Ye |
| 2010/0327247 | A1* | 12/2010 | Ward et al. ............ 257/2 |

OTHER PUBLICATIONS

Ajayan et al., "Nanometre-size tubes of carbon," Rep. Prog. Phys., 1997, vol. 60, pp. 1025-1062.*
Adee, , "The Mysterious Memristor", pp. 1-5, IEEE Spectrum Online; May 2008; http://www.spectrum.ieee.org/ may08/6207; website last visited May 5, 2008.
Aguirre, et al., "Carbon Nanotubes as Injection Electrodes for Organic Thin Film Transistors", Nano Letters, 2009, vol. 9, No. 4, 1457-1461.

(Continued)

*Primary Examiner* — Michael Lebentritt
*Assistant Examiner* — Kevin Quinto
(74) *Attorney, Agent, or Firm* — Guntin & Gust, PLC; Ed Guntin (57) ABSTRACT

A device that incorporates teachings of the present disclosure may include, for example, a memory array having a first array of nanotubes, a second array of nanotubes, and a state changing material located between the first and second array of nanotubes. Other embodiments are disclosed.

20 Claims, 7 Drawing Sheets

(56) References Cited

OTHER PUBLICATIONS

Bichet, , "Local characterization and transformation of phase-change media by scanning thermal probes", J. Appl. Phys. 95, 2360 (2004).
Boniardi, , "Physical origin of the resistance drift exponent in amorphous phase change materials", Appl. Phys. Lett. 98, 243506 (2011).
Bonsor, , "How Nanotechnology Works", http://science.howstuffworks.com/nanotechnology2.htm; Nov. 20, 2012.
Borghetti, , "'Memristive' switches enable 'stateful' logic operations via material implication", Nature, vol. 464/8, Apr. 2010.
Bruns, et al., "Nanosecond switching in GeTe phase change memory cells", Appl. Phys. Lett. 95, 043108 (2009).
Burr, et al., "Phase change memory technology", J. Vac. Sci. Technol. B 28(2), Mar./Apr. 2010.
Chen, et al., "Compact Thermal Model for Vertical Nanowire Phase-Change Memory Cells", IEEE Transactions on Electron Devices, vol. 56, No. 7, Jul. 2009.
Chen, , "Highly Scalable Hafnium Oxide Memory with Improvements of Resistive Distribution and Read Disturb Immunity", IEEE, 97-4244-5640-06/09, 2009.
Chen, et al., "Programmable via Using Indirectly Heated Phase-Change Switch for Reconfigurable Logic Applications", IEEE Electron Device Letters, vol. 29, No. 1, Jan. 2008.
Chen, et al., "Ultra-Thin Phase-Change Bridge Memory Device Using GeSb", IBM/Qimonda/Macronix PCREAM Joint Project, Dec. 2006.
Chua, , "Low resistance, high dynamic range reconfigurable phase change switch for radio frequency applications", Appl. Phys. Lett. 97, 183506 (2010).
Guo, , "Covalently Bridging Gaps in Single-Walled Carbon Nanotubes with Conducting Molecules", Science 311, 356 (2006).
Ielmini, et al., "Analytical model for subthreshold conduction and threshold switching in chalcogenide-based memory devices", J. Appl. Phys. 102, 054517 (2007).
Ielmini, , "Reliability Impact of Chalcogenide-Structure Relaxation in Phase-Change Memory (PCM) Cells—Part I: Experimental Study", IEE Transactions on Electron Devices, vol. 56, No. 5, May 2009.
Ielmini, , "Threshold switching mechanism by high-field energy gain in the hopping transport of chalcogenide glasses", Physcial Review B 78, 035308 (2008).
Im, et al., "A Unified 7.5nm Dash-Type Confined Cell for High Performace PRAM Device", Process Development Team, Samsung Electronics Co. Ltd, 2008.
Jin, , "Localized Termperature and Chemical Reaction Control in Nanoscale Space by Nanowire Array", Nano Lett. 2011, 11, 4818-4825.
Kalb, et al., "Kinetics of crystal nucleation in undercooled droplets of Sb- and Te-based alloys used for phase change recording", J. Appl. Phys. 98, 054910 (2005).
Kang, , "PRAM cell technology and characterization in 20nm node size", IEEE, 2011, 978-1-4577-0505-2/11.
Karpov, , "Field-induced nucleation in phase change memory", Physical Review B 78, 052201 (2008).
Khajetoorians, "Realizing All-Spin-Based Logic Operations Atom by Atom", Science 332, 1062 (2011).
Kolobov, et al., "Understanding the phase-change mechanism of rewritable optical media", Nature Materials, vol. 3, Oct. 2004.
Krebs, et al., "Threshold field of phase change memory materials measured using phase change bridge devices", Appl. Phys. Lett. 95, 082101 (2009).
Lacaita, "Phase change memories: State-of-the-art, challenges and perspectives", Solid-State Electronics 50 (2006) 24-30.
Lankhorst, et al., "Low-cost and nanoscale non-volatile memory concept for future silicon chips", Nature Materials, vol. 4, Apr. 2005.
Lee, et al., "Highly scalable non-volatile and ultra-lowpower phase-change nanowire memory", Nature Nanotechnology, vol. 2, Oct. 2007.
Lee, et al., "Highly Scalable Phase Change Memory with CVD GeSbTe for Sub 50nm Generation", 2007 Symposium on VLSI Technology Digest of Technical Papers.
Li, , "Explore Physical Origins of Resistance Drift in Phase Change Memory and its Implicatios for Drift-insensitive Materials", IEEE, 2011, 978-1-4577-0505-2/11.
Liang, , "A 1.4uA Reset Current Phase Change Memory Cell with Integrated Carbon Nanotube Electrodes for Cross-Point Memory Application", 2011 Symposium on VLSI Technology Digest of Technical Papers.
Liao, , "Avalanche-Induced Current Enhancement in Semiconducting Carbon Nanotubes", PRL 101, 256804 (2008).
Liao, et al., "Thermal dissipation and variability in electrical breakdown of carbon nanotube devices", Physical Review B 82, 205406 (2010).
Lin, , "Self-Aligned Nanolithography in a Nanogap", Nano Letters, 2009, vol. 9, No. 6, 2234-2238.
Lyeo, et al., "Thermal conductivity of phase-change material Ge2Sb2Te5", Appl. Phys. Lett. 89, 151904 (2006).
Markoff, , "H.P. Unveils New Memory Technology", pp. 1-3, New York Times; May 1,2008; http://www.nytimes.com/2008/05/01/technology; website last visited May 5,2008.
McCamey, , "Electronic Spin Storage in an Electrically Readable Nuclear Spin Memory with a Lifetime > 100 Seconds", Science 330, 1652 (2010).
Meister, et al., "Void Formation Induced Electrical Switching in Phase-Change Nanowires", Nano Letters, 2008, vol. 8, No. 12, 4562-4567.
Mitra, , "Extremely low drift of resistance and threshold voltage in amorphous phase change nanowire devices", Appl. Phys. Lett. 96, 222111 (2010).
Pirovano, , "Scaling Analysis of Phase-Change Memory Technology", IEEE 2003, 0-7803-7872-5/03.
Pop, et al., "Electrical and thermal transport in metallic single-wall carbon nanotubes on insulating substrates", J. Appl. Phys. 101, 093710 (2007).
Pop, , "Energy Dissipation and Transport in Nanoscale Devices", Nano Res (2010) 3: 147-169.
Pop, , "The role of electrical and thermal contact resistance for Joule breakdown of single-wall carbon nanotubes", Nanotechnology 19 (2008) 295202 (5pp).
Qi, et al., "Miniature Organic Transistors with Carbon Nanotubes as Quasi-One-Dimensional Electrodes", J. Am. Chem. Soc. 2004, 126, 11774-11775.
Raoux, , "Phase-change random access memory: A scalable technology", IBM J. Res. & Dev. vol. 52, No. 4/5, Jul./Sep. 2008.
Redaelli, et al., "Electronic Switching Effect and Phase-Change Transition in Chalcogenide Materials", IEEE Electron Device Letters, vol. 25, No. 10, Oct. 2004.
Russo, , "Modeling of Programming and Read Performance in Phase-Change Memories—Part I: Cell Optimization and Scaling", IEEE Transactions on Electron Devices, vol. 55, No. 2, Feb. 2008.
Sands, , "Nanotubes and Nanowires", NCLT Jul. 13, 2006.
Servalli, "A 45nm Generation Phase Change Memory Technology", IEEE, 2009, 97/4244-5640-6/09.
Strukov, , "The Missing Memristor Found", 1 page, Nature International Weekly Journal of Science, 453, 80-83; May 1, 2008; http://www.nature.com/nature/journal/v453/n7191/abs/nature06932.html; website last visited May 5, 2008.
Thiele, , "Controlled fabrication of single-walled carbon nanotube electrodes by electron-beam-induced oxidation", Appl. Phys. Lett. 99, 173105 (2011).
Venkatesan, , "Stacked Graphene-Al2O3 Nanopore Sensors for Sensitive Detection of DNA and DNA-Protein Complexes", ACS Nano, vol. 6, No. 1, 441-450, 2012.
Wang, et al., "Fast phase transitions induced by picosecond electrical pulses on phase change memory cells", Appl. Phys. Lett. 93, 043121 (2008).
Waser, , "Nanoionics-based resistive switching memories", Nature Materials, vol. 6, Nov. 2007.
Wong, , "Phase Change Memory", IEEE No. 12, Dec. 2010, Proceedings of the IEEE, vol. 98, No. 12, Dec. 2010.

(56) References Cited

OTHER PUBLICATIONS

Wong, et al., "Phase Change Memory", Proceedings of the IEEE, vol. 98, No. 12, Dec. 2010.

Wuttig, et al., "Phase-change materials for rewriteable data storage", Nature Materials, vol. 6, Nov. 2007.

Xiong, , "Inducing chalcogenide phase change with ultra-narrow carbon nanotube heaters", Appl. Phys. Lett. 95, 243103 (2009).

Xiong, , "Low Power Switching of Phase-Change Materials with Carbon Nanotube Electrodes", Science Express, Mar. 10, 2011.

Yang, , "Memristive swtiching mechanism for metal/oxid/metal nanodevices", Nature Nanotechnology, vol. 3, Jul. 2008.

Yao, et al., "Resistive Switching in Nanogap Systems on SiO2 Substrates", Small 2009, 5, No. 24, 2910-2915.

Yoon, , "Phase-Change-Driven Programmable Switch for Nonvolatile Logic Applications", IEEE Electron Device Letters, vol. 30, No. 4, Apr. 2009.

Yu, et al., "Minimum Voltage for Threshold Switching in Nanoscale Phase-Change Memory", Nano Letters, 2008, vol. 8, No. 10, 3429-3433.

\* cited by examiner

*Prior Art*

| Figure of Merit | FLASH | PCM | NEMS | Nanotube-PCM |
|---|---|---|---|---|
| Area (nm²) | 6000 | 3600 | 1000 | 4 |
| Time (ns) | 100 | 50 | 10 | 0.4 |
| Energy (fJ) | 100 | 35,000 | 1-100 | <1 |
| Voltage (V) | 15 | 1 | 5-25 | 1 |
| On/Off Ratio | 10 | 100 | >1000 | >100 |

FIG. 13

| Parameters | Nanotube | a-GST | c-GST |
|---|---|---|---|
| Density ρ (kg/m³) | 2250 | 5900 | 5600 |
| Specific Heat C (J/kg-K) | 660 | 210 | 210 |
| Thermal Conductivity k (W/m-K) | 3000 | 0.25 | 0.5-1.0 |

FIG. 14

| d_GST (nm) | r_CNT (nm) | E(a→c) (fJ) | ΔE/E |
|---|---|---|---|
| 7 | 0.5 → 2 | 0.35 → 0.21 | 40% |
| 11 | 0.5 → 2 | 0.62 → 0.40 | 35% |
| 15 | 0.5 → 2 | 0.80 → 0.64 | 20% |

FIG. 15

STATE CHANGING DEVICE

CROSS-REFERENCE TO RELATED APPLICATIONS

This application is a continuation of and claims priority to U.S. patent application Ser. No. 12/463,953 filed May 11, 2009. The contents of each of the foregoing is/are hereby incorporated by reference into this application as if set forth herein in full.

FIELD OF THE DISCLOSURE

The present disclosure relates generally to adaptive devices, and more specifically to a state changing device.

BACKGROUND

The mass-storage market is currently dominated by magnetic hard drives, which can range in capacity up to a terabyte or more. In the gigabyte range, prior art solid-state Flash memory (FIG. 3) have been used by computing devices such as laptop computers and media players. However, hard drives contain movable parts, are generally slower, less robust, and consume more power than solid-state memory.

Figure 3:
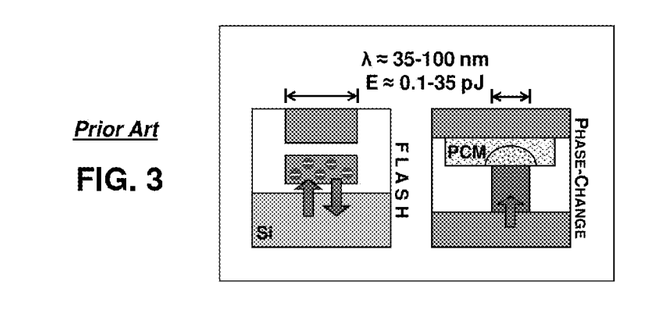
FIG. 3 depicts an illustrative embodiment of a prior art non-volatile memory devices. This includes Flash memory [4], which is limited by charge storage (a few hundred electrons) on the floating gate, and the vertical "lance" phase-change memory (PCM) which is limited by high write/erase power required [4]. Flash memory is a commercial product, "lance" PCM is still in the research/development phase.

For Flash memories to achieve the storage capacity of hard drives, the storage element of a Flash memory would have to be reduced substantially in scale. However, at scales below 35 nm technology, a memory cell typically retains only a hundred (or fewer) electrons [1]. Such few stored electrons lead to significant statistical bit-to-bit variation, as well as poor charge retention, since long-term storage imposes drastic leakage current limits, of the order of one or two electrons per month. Another drawback of Flash memories is its high write/erase voltage (~15 V), which is needed for tunneling in/out of the floating gate (FIG. 3). Such voltages are incompatible with the low 1-2 Volts commonly used in logic operation. To compensate for this disparity, large area charge pumps are often used to step up the voltage, consuming valuable on-chip real estate, and in some instances causing electromagnetic interference which can have a harmful effect on consumer devices with radio transceivers such as cellular phones.

Using a reversible change of phase (amorphous to/from crystalline) as a state variable circumvents the Flash scaling and radiation sensitivity problem. With phase change material (PCM) technology, the logic bit is stored as a large (100× or more) change in resistivity of certain materials that comes about with a structural change of phase. Such memory is currently operated at bit dimensions of approximately 90 nm, in the "lance" configuration shown in FIG. 3. This is based on a single via, typically made out of a TiN "heater" element with a GST ($Ge_2Sb_2Te_5$) top.

"Lance"-PCM operation at low voltages compatible with logic is achievable, but the large current and energy needed to change the phase of the lance-PCM bit is still a significant drawback. This is due to the relatively large volume (10,000s of $nm^3$) that must be Joule-heated. A recent improvement has been the development of individual phase-change material nanowires with diameters in the 30-100 nm range [3]. Unfortunately, little control can be maintained over the nanowire diameter, and hence on individual cells within an array, and even 30 nm diameter nanowires require (large) transition energies of the order 35 pJ (see FIG. 13).

There are a few more memory (or circuit) switch alternatives. A good overview is provided by Ref. [9], including FeRAM (ferroelectric), MRAM (magnetic, spin-based), NEM (nano-electro-mechanical), and MIM (conductive filament bridging electrodes) devices. None appears to be a strong contender for a non-volatile switch with high on/off ratio and ultra-low energy requirement.

Figure 4:
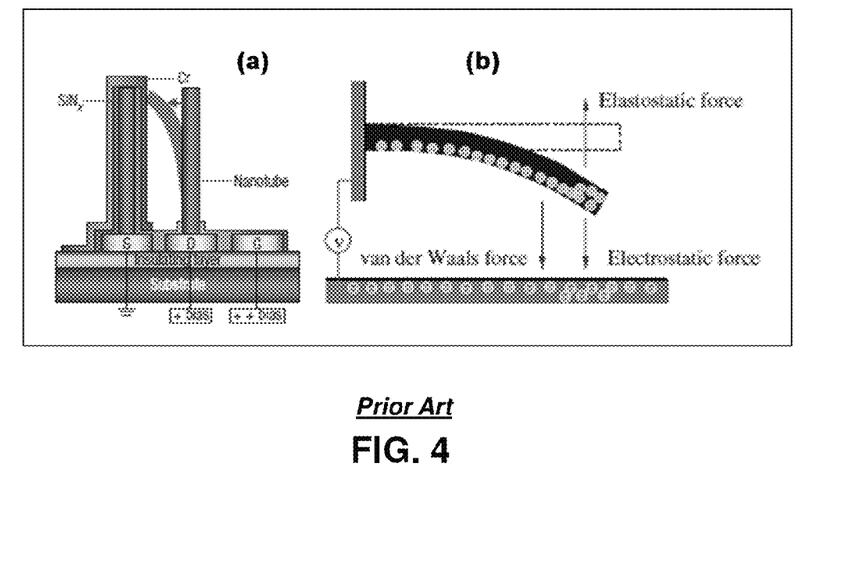
FIG. 4 depicts an illustrative embodiment of prior art designs for nano-electro-mechanical (NEMS) switches are based on flexible nanobeams, cantilevers, or nanotubes. Designs (a) and (b) are reproduced from Refs. [5] and [6] respectively. Unlike Flash and "lance" PCM (FIG. 3), such NEMS switches are much farther from commercial applications today.

MRAM has high energy and area requirements, MIM and FeRAM have shown very challenging material issues, and none (except for NEMS) provide very good on/off behavior, i.e. the basic function of a true nanoscale switch with applicability beyond niche non-volatile memory. The NEMS switch is prototypically shown in FIG. 4, which in its current designs typically suffers from large voltage actuation requirements (5-25 V), and slow response times owed to the mechanical motion of the cantilever or nanobeam.

BRIEF DESCRIPTION OF THE DRAWINGS

FIG. 7 depicts an illustrative embodiment of a three-dimensional simulation (cross-section) of nanotube cross-point and filament formation within the phase-change GST film.

One nanotube electrode is at the bottom along the x-axis, the other is 10 nm above and perpendicular to it. Both are actuated with a 0.4 µW power step, and the temperature profile computed at 0.2, 0.4, 1 and 3 ns;

DETAILED DESCRIPTION

An embodiment of the present disclosure can entail a device, comprising a first nanotube coupled to a resistive change material (RCM). In an embodiment, the RCM can correspond to a phase-change material (PCM).

An embodiment of the present disclosure can entail growing a first array of nanotubes on a substrate, applying an RCM to the first array of nanotubes, and applying a second array of nanotubes to the RCM.

An embodiment of the present disclosure can entail a memory cell having at least one nanotube heating element coupled to an RCM.

An embodiment of the present disclosure can entail an apparatus having a memory array that selectively stores memory states in an RCM coupled to at least one nanotube heating element, and a computing device coupled to the memory array.

An embodiment of the present disclosure can entail a memory array having a first array of nanotubes, a second array of nanotubes, and an RCM located between the first and second array of nanotubes.

An embodiment of the present disclosure can entail offering for sale a memory array. The memory array having a first array of nanotubes, a second array of nanotubes, and an RCM located between the first and second array of nanotubes.

An embodiment of the present disclosure can entail a computer-readable storage medium having computer instructions, wherein computer-readable storage medium corresponds to a memory array a first array of nanotubes, a second array of nanotubes, and an RCM located between the first and second array of nanotubes.

Figure 1A:
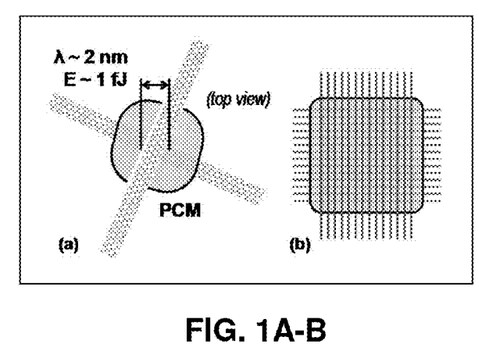
FIG. 1 depicts an illustrative embodiment of (a) Top view of crossed nanotubes with phase-change material (PCM) middle layer. This forms a reversible vertical switch with dimensions comparable to the nanotube diameter ~2×2 $nm^2$. The nanotubes are connected to metal electrodes, not shown. (b) Nanotube/phase-change array used either as a dense, low-power non-volatile memory, or as a parallel array of circuit access switches; (c) alternate nanotube-PCM geometry with phase-change material (GST) filling a gap between two single-wall nanotubes (SWNTs), or a gap created after locally breaking up the same SWNT. Nanotubes are connected to metal electrodes, not shown.
Figure 1C:
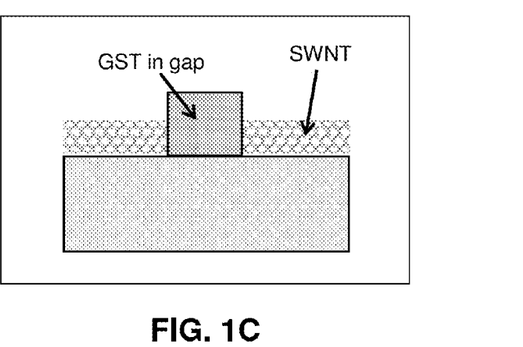

According to the present disclosure, a switch can be a cross-point of two single-wall carbon nanotubes (SWNTs) with a thin PCM core (FIG. 1A). A switch can also be a gap between two SWNTs, filled with a PCM core (FIG. 1C). The resistivity of phase-change materials changes by several orders of magnitude as they are switched between their amorphous and crystalline states. This switching can be actuated with Joule heating pulses.

A single-wall carbon nanotube (diameter λ~2 nm) is the narrowest controllable electrode and line heat source known at the present time. This makes the nanotube cross-point the smallest controllable point heat source (area A~4 $nm^2$).

The thickness of the PCM layer can be optimized to dominate thermal transport at the nanotube cross-point, thus determining the switch properties (supported by simulations discussed below). This allows a wide range (1-5 nm, or more) of useful nanotube diameters, alleviating their intrinsic variability. Thus, single-as well as few-wall nanotubes can form acceptable cross-points, increasing yield in large-scale applications.

The principles of low-temperature techniques for transferring large arrays of parallel nanotubes to form the electrodes [4] can be used to transfer top electrodes after the temperature-sensitive PCM layer is deposited.

Figure 2A:
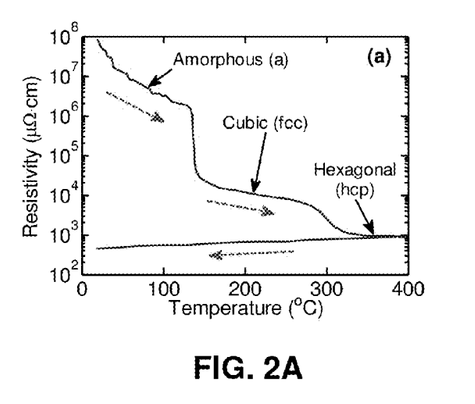
FIG. 2 depicts an illustrative embodiment of (a) Temperature variation of $Ge_2Sb_2Te_5$ electrical resistivity [2] The dashed arrows indicate the direction of the temperature ramp. (b) Typical switching characteristic between the crystalline (low-resistance, logic "0") and amorphous (high resistance, logic "1") state of the material [6]. Note, the current needed to obtain such temperatures and switching with nanotube cross-points will be much lower, of the order 1-10 µA.

The phase-change material can be a glassy alloy like GST ($Ge_2Sb_2Te_5$), with a transition temperature of approximately 150° C. between the amorphous (a) and fcc phase, and approximately 300° C. transition between the fcc and hcp crystalline states. The material resistivity changes by several orders of magnitude between these phases, and voltage-controlled Joule heating pulses can be used to induce switching (FIG. 2a).

Figure 2B:
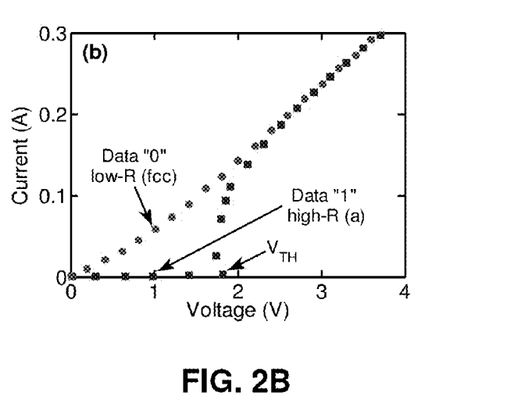

The resistance change between orthogonal "word" and "bitlines" can be read, forming easily distinguishable states "0" and "1" (see, e.g. FIG. 2b). A stronger Joule heating pulse can melt the material near 600° C., and (if rapidly quenched) "freeze" it back into a vitreous amorphous phase. This returns the bit to the "1" state and provides reversibility of the memory. In addition, the amorphous state can be resistive enough to serve as an "off" circuit switch, although the on/off resistivity ratio can also be tailored by adjusting material stoichiometry (application-dependent).

As all transition temperatures are relatively elevated, the PCM is stable (non-volatile) at room-temperature ambient conditions. It is worth noting, as shown through simulations (described below), that an entire row (wordline) may be crystallized, writing all "0"s at once by bringing the temperature of a single nanotube above 150° C., but that the "1" write process may be more effectively done one bit at a time, to avoid thermally disturbing neighboring cross-points.

The extremely low energy (sub-fJ) and time scale (sub-ns) associated with the nanotube-PCM cross-bar switch can be understood by the very small volume of phase-change material that is thermally actuated at the nanotube intersection. This volume is only of the order of a filament with dimensions (approximately) 2×2×10 nm, or less than 100 nm³ even if thermal diffusion into the surrounding PCM is taken into account. The thermal diffusion length is itself very small (5-10 nm) owing to the rapid time scale (<1 ns) during which the temperature of the nanotube can be raised enough to produce material phase-change, as supported by finite-element simulations.

An extremely small, controllable switch with high speed and low energy metrics could be a key enabler of nanoelectronics.

Figure 10:
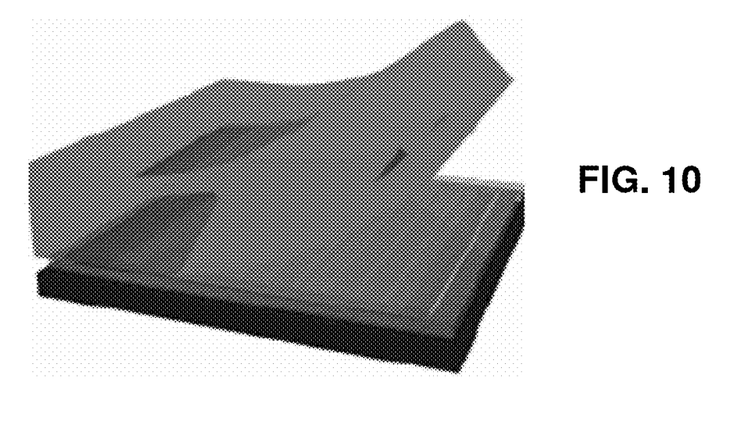
FIG. 10 depicts an illustrative embodiment of a the top nanotube electrode is transferred onto the GST through a low-temperature microcontact-printing process [1]

The components of the nanotube-PCM cross-bar switch of FIG. 1 may be assembled at low temperatures through sputtering and microcontact-printing (although in the single-switch process described below, only the top nanotube electrode may be)—see also FIG. 10. In other words, the technology itself is in fact transferable onto sensitive, flexible substrates for large-scale arrays. An illustrative embodiment of microcontact-printing can be found in U.S. Patent Application no. 2008/0224358, entitled "Nano-Molding Process", which is incorporated by reference in its entirety into the present disclosure.

The switch described in the present disclosure is not an incremental advance over the "lance"-shaped PCM design, which is specifically targeted for insertion down the Flash scaling path after the latter can no longer be downsized (~35 nm technology node). Flash is believed to be unfeasible beyond the $\lambda$=35 nm technology (bit area for NAND Flash$\approx$5$\lambda^2$=6000 nm²), at a write time $\tau\approx$100 ns (read 10 ns) and energy/bit$\approx$0.1 pJ [5]. The introduction of a commercial phase-change memory would have to intercept and exceed the 35 nm Flash performance. Using the most recent PCM nanowire data available today [3] with 30 nm diameter, the bit area for a cross-bar architecture=4$\lambda^2$=3600 nm², write time $\tau\approx$50 ns and energy/bit$\approx$35 pJ, as summarized in FIG. 13.

By comparison, for the single-wall nanotube electrodes proposed in the present disclosure the net bit area is of the order of the nanotube diameter, 4$\lambda^2$=16 nm² (including space between cells, or 4 nm² for the bit itself). With a 10 nm thin GST film between the electrodes, the write time and energy per bit can be estimated at about 0.3 ns and 0.1 fJ, respectively. These are the time and energy needed to induce phase-change in a cylindrical GST filament at the nanotube cross-bar junction. A more accurate assessment from finite-element simulations including 3-dimensional dissipation during pulsed heating from the nanotube into the GST is provided.

An improvement of at least two orders of magnitude can be expected over the best present (or extrapolated) state of the art features for both Flash and nanowire-PCM. Note that the present state of the art density of aligned nanotube patterning is approximately 10-20 nanotubes per µm [4]. Even if this figure were improved only by a factor of two in the near future, the nanotube-PCM switch (memory) can match the density of other non-volatile contenders, while exceeding the speed/energy parameters by two orders of magnitude.

GST layers of thickness between 2-20 nm are easily deposited, and known to exhibit amorphous/crystalline phase-change [6]. The simulations show a fundamental trade-off: thinner GST lowers the switching energy, but magnifies the effect of nanotube diameter variability (itself in the 1-4 nm range).

Figure 5:
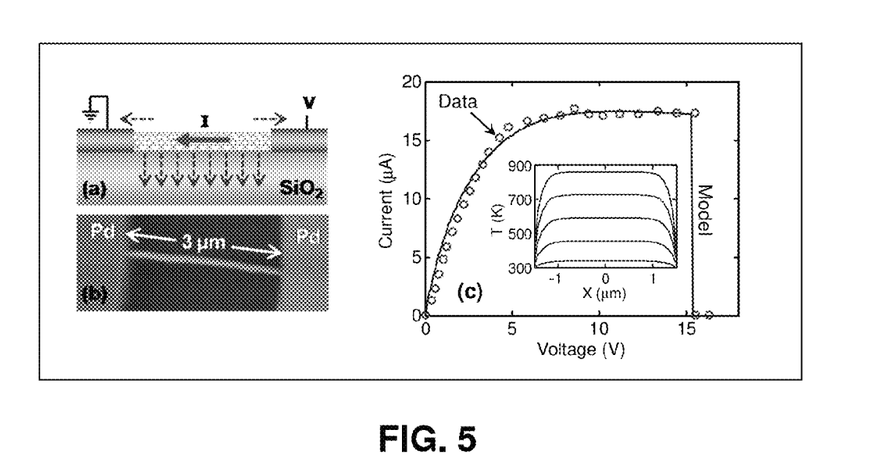
FIG. 5 depicts an illustrative embodiment of (a) Schematic of single nanotube heater and (b) SEM. Solid blue arrow shows current flow, red dashed arrows represent heat flow. (b) I-V data and model with Joule heating up to breakdown as shown in [6]. The inset shows the temperature profile along the tube at V=3, 6, 9, 12, 15 V, during steady Joule heating.
Figure 11:
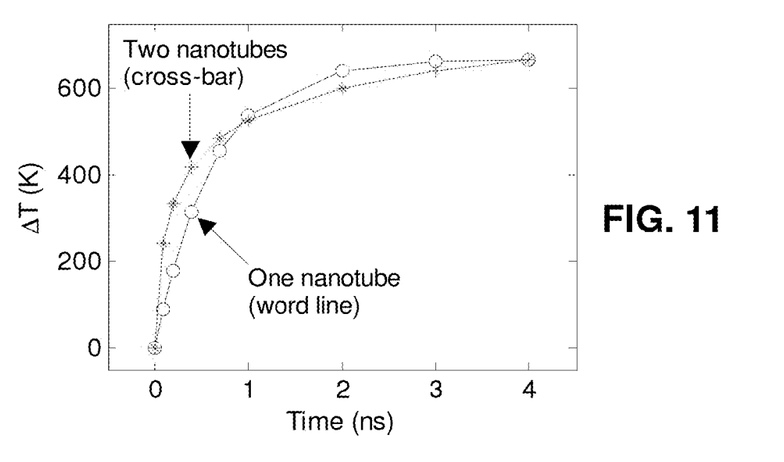
FIG. 11 depicts an illustrative embodiment of a computed transient peak temperature rise for the one-nanotube wordline (FIG. 6) and the two-nanotube cross-point (FIG. 7). The input power is a 10 µW step for the wordline case, and 4 µW for the cross-point. A cross-point risetime of ~0.4 ns can be reached.

Finite element simulations have been carried out. First, a single nanotube heater in the configuration shown in FIG. 5a is considered. The nanotube is a few microns long, rests on SiO₂, and bridges two metal electrodes. From above, it is covered with the phase-change material GST, as in FIG. 6. A Joule heating pulse is initiated in the nanotube, and the maximum temperature rises by hundreds of K within a nanosecond. The actual rise is plotted with open circles in FIG. 11. This is the case of a single nanotube wordline.

Figure 8:
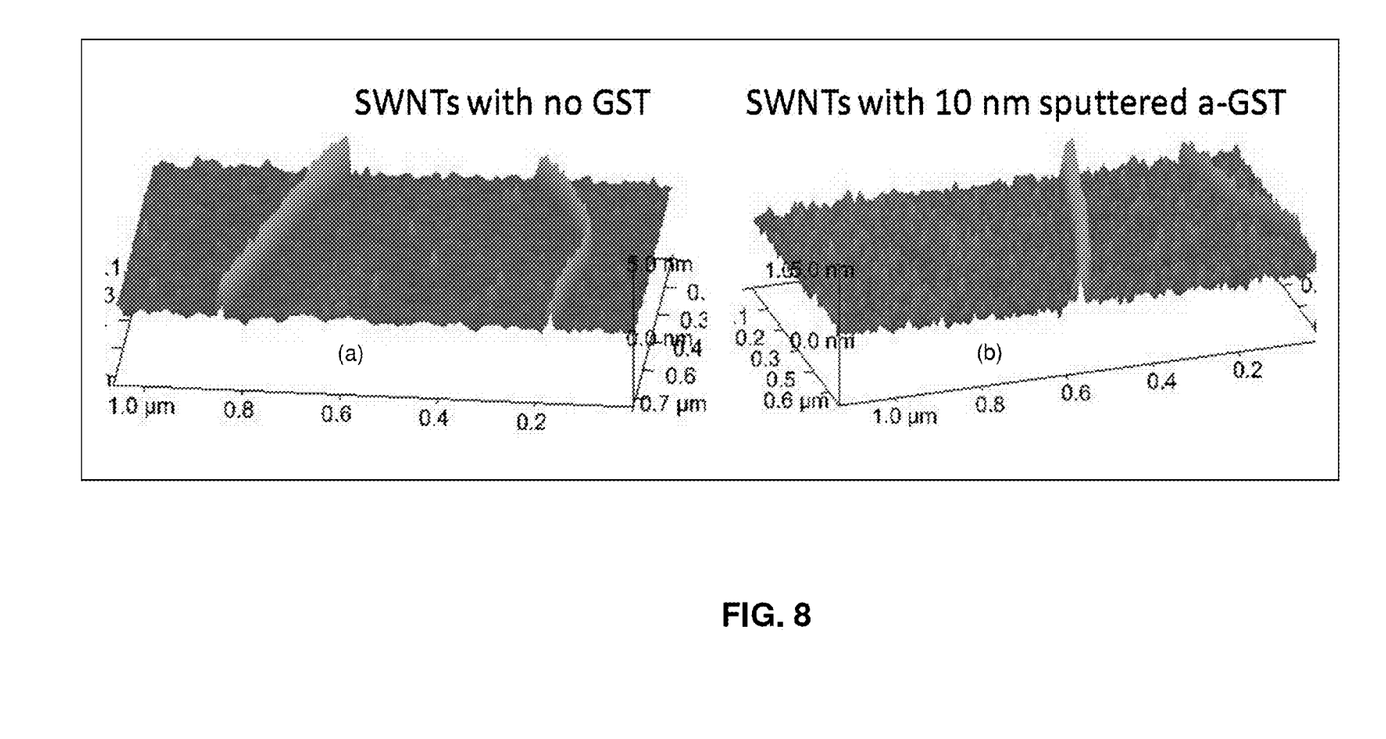
FIG. 8 depicts an illustrative embodiment of (a) Atomic Force Microscope (AFM) topography of typical SWNTs as-grown on $SiO_2$ surface, and (b) AFM topography image of same SWNTs after sputtering of ~10 nm amorphous GST film, showing conformal deposition and small change in surface roughness.
Figure 9:
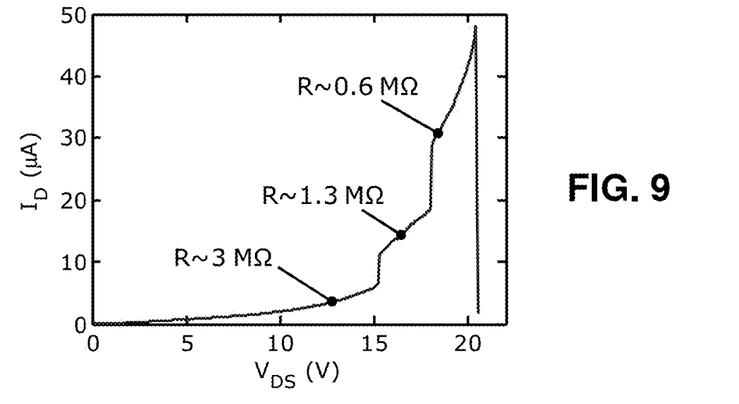
FIG. 9 depicts an illustrative embodiment of an I-V sweep revealing current steps corresponding to changes in the GST phase, from amorphous to fcc crystalline, and then to hcp crystalline (here, up to nanotube breakdown)

Preliminary experimental results are available. A device has been built following the procedure above, with GST covering the entire nanotube. First, it has been shown that GST covers the nanotube with atomic-scale conformance, FIG. 8. Second, it has been shown that such prepared GST-nanotube devices indeed exhibit resistance switching behavior, shown in FIG. 9.

Figure 6:
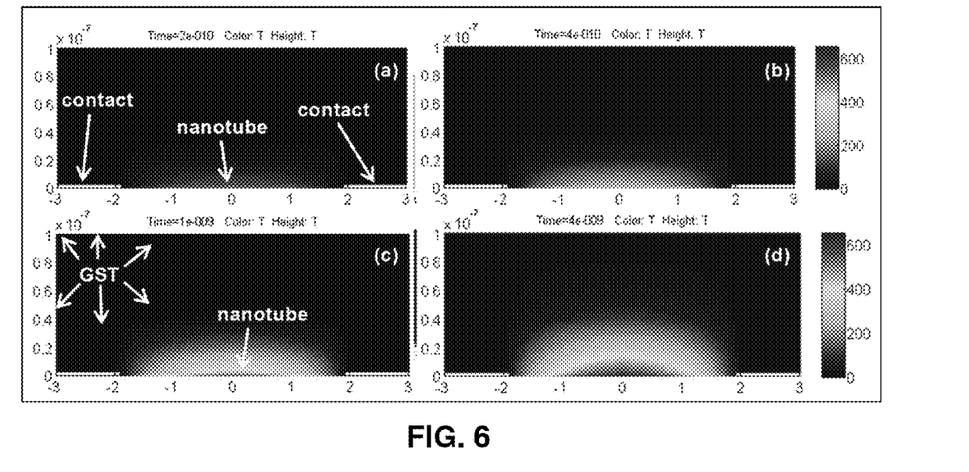
FIG. 6 depicts an illustrative embodiment of a three-dimensional (cylindrically-symmetric) simulation of temperature profiles at 0.2, 0.4, 1 and 4 ns after a 10 µW Joule-heating pulse into a 4 µm long nanotube covered by GST. The horizontal axis units are µm, vertical axis is in m. The temperature quickly reaches >600° C., with a 1/e time constant of ~0.5 ns. The temperature is nearly uniform along the nanotube, up to within ~1 µm of the electrodes. However the thermal drop into the GST is very sharp (>50%) within 20 nm.
Figure 14:
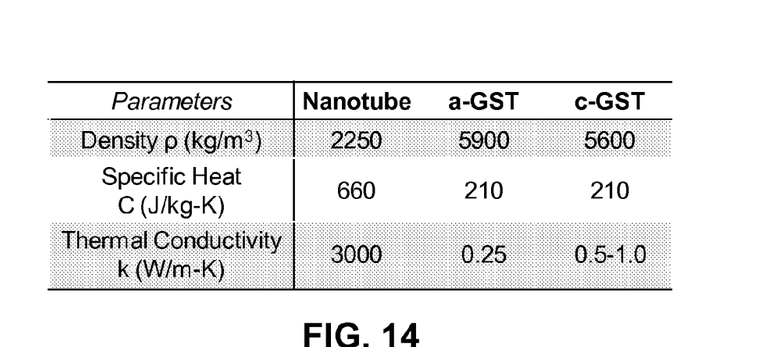
FIG. 14 depicts an illustrative embodiment of material parameters used in the simulations [7,13]

Note that the temperature profile in FIG. 6 is highly non-uniform between the axial and radial direction. The temperature is nearly constant along the nanotube, except within <1 µm of the (cold) contacts. However, it drops precipitously into the GST within <20 nm. This is due to the very low thermal conductivity of GST (FIG. 14) and the radial (cylindrical) heat spreading out from the nanotube. This suggests that nearly the entire length of a nanotube wordline, except the region near the contacts, can be used to simultaneously address all bits along it. The very short thermal drop length into the GST suggests that the cross-point filament (bit) must be within ~10 nm of the wordline, and that other adjacent bits must be placed farther away to avoid thermal disturbance. Combining the two observations, it can be observed that up to 100 bits/µm could be simultaneously crystallized ($T_{a \to c} \approx$150° C.) with a single, short power pulse to their wordline.

Figure 7:
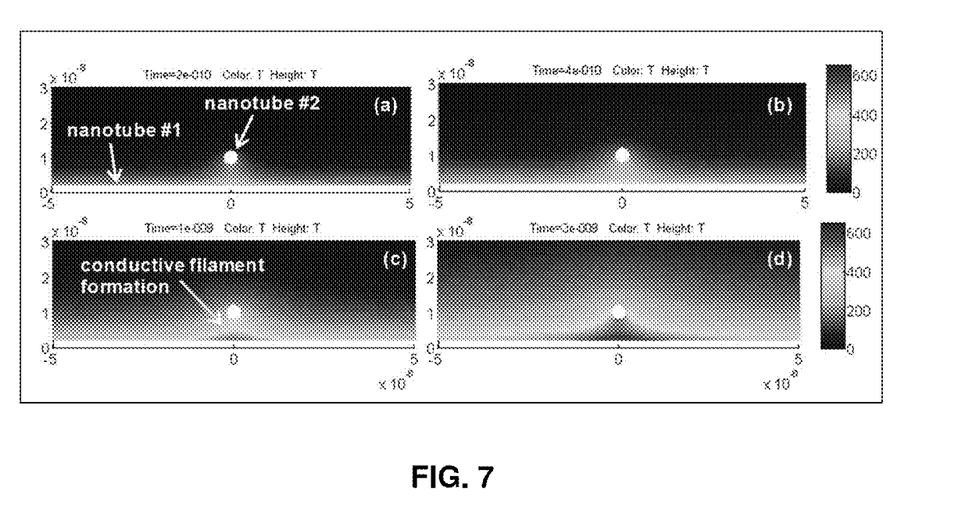

The reverse operation can be performed by pulse-heating both the nanotube wordline and bitline, such as to select an individual cross-point ($T_{c \to a} \approx$600° C.). This is also limited by thermal cross-talk between adjacent bits, but it can be accomplished with approximately half the power in each of the two nanotubes. This is the scenario modeled in FIG. 7. Note that crystallization (a→c) can also be performed one bit at a time, although in many instances (such as mass-erase) it would be advantageous to erase hundreds of bits, i.e. an entire wordline, at once.

The read operation can be performed by sensing the resistance change between two orthogonal word/bitlines. Using the amorphous and crystalline GST resistivity from FIG. 2 and a nanotube cross-point separation of 10 nm, the resistance of the amorphous bit is estimated of the order 250 MΩ, and that of the crystalline bit of the order 100 kΩ. The latter depends on whether the bit is fcc or hcp crystalline, which is controlled by the Joule heating pulse energy and time. In either case, the resistance of the nanotube electrodes themselves (typically <50 kΩ, including any imperfect contact resistance) is not dominant, and the bit resistance change is easily sensed.

Individual nanotubes have relatively low thermal conductance, owing to their small diameter [7]. Recent work [10] has shown that single-wall nanotubes act like the narrowest heaters known to man, achieving several hundred degrees temperature rise at a power of only a few µW per µm length. FIG. 5 illustrates this through the agreement between an electro-thermal nanotube model and the experimentally measured data. This model and the high temperatures have also been recently confirmed through optical measurements [8].

The nanotube-GST switch can be built as follows. The bottom nanotube electrode (FIG. 1, FIG. 5a, FIG. 6-7) is grown in situ by the CVD process on an SiO₂/Si substrate, with Fe catalyst. As a first pass, any semiconducting nanotubes can be disregarded and only metallic ones used. Or, semiconducting nanotubes can be used if turned on by the bottom (Si) wafer gate. Pairs of Ti/Pd metal electrodes are patterned on nanotubes with spacing between 1 and 20 µm, forming numerous device test sites. Recent work [10] suggests the nanotube temperature is maximized for an electrode spacing closer to 1 µm (most heating at lowest power input), with voltages near 2 V being sufficient to provide up to 600° C. However, longer nanotube wordlines may be used, with the voltage correspondingly scaled up. Note, this is the distance between the metal electrodes, not a restriction on the minimal switch size itself.

The phase-change material (GST) island (FIG. 1a) is defined in photoresist, between the bottom nanotube heater electrodes. A thin GST film (~10 nm) is sputtered, then patterned via lift-off. The thickness of the GST film can be controlled in the 2-20 nm range [11].

It may not be possible to grow by CVD the top nanotube electrode since the GST does not typically withstand the CVD furnace temperatures. The top electrode can be grown on a separate quartz substrate, and then transferred onto the GST/bottom-nanotube sample. This can achieved through a simple, low-temperature microcontact-printing process which involves coating the nanotubes on quartz with an Au/polymer (PVA) bilayer, applying an elastomeric (PDMS) stamp, then peeling it off. The nanotubes adhere to the stamp through van der Waals forces, and is transferred to the receiving substrate. After peeling back the PDMS stamp, the PVA is rinsed, and the Au etched [1].

This process has been shown to provide near-100% nanotube transfer efficiency. It was developed at UIUC, and is currently being used for nanotube array transfers in a different study. Contacting individual nanotubes within an array (with <1 µm pitch), and the transfer process may also be used for the bottom electrode, thus enabling low-temperature fabrication, and integration onto a variety of sensitive, flexible substrates.

The two metal contacts to the top nanotube electrode are formed via photolithography and lift-off. Note that exact alignment (or orthogonality) of the transferred top nanotube with the bottom nanotube electrode and the GST island are not required to obtain one functional switch. Several top nanotubes may be transferred simultaneously to enhance the probability of obtaining several functional cross-points. Better alignment becomes more important when extending this work to a cross-bar array (FIG. 1B).

The as-deposited GST film is amorphous, and therefore the cross-bar bit is initially an "open" circuit (~250 MΩ). The switch will first be tested with DC Joule heating applied to the bottom or top electrode (or both). The local temperature can be easily raised above 150° C. at only a few Volts, and a significant drop in cross-bar resistance (between the crossed nanotubes) will be measured.

To reverse the state of the bit, transient heating (voltage) pulses can be applied. Varying amplitude and width, from 10 ns to 0.3 ns can be obtained with an Agilent 81133A pulse generator. A GSG electrode configuration can be used, and care should be taken to avoid signal reflections. Longer, low-amplitude pulses can also be used to crystallize bits (1→0), and shorter high-amplitude in order to melt-quench and re-amorphize them (0→1). The latter also benefit from the GST conductive state, and from Joule heating in the bit itself. Hence the melt-quench set time may be faster than the 0.4-1 ns predicted by the simulations in FIG. 7 and FIG. 11.

Figure 13:
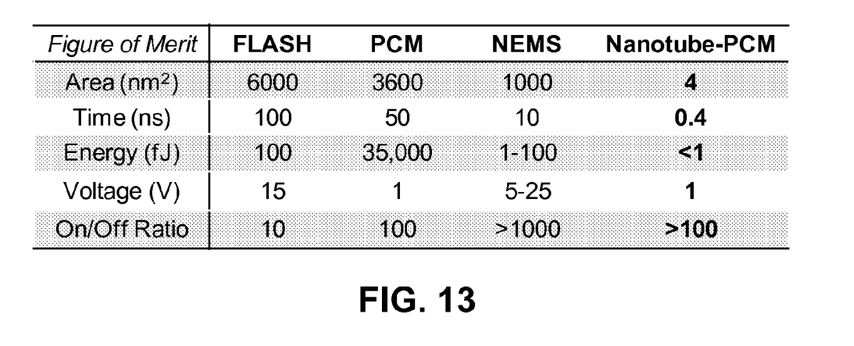
FIG. 13 depicts an illustrative embodiment of an order of magnitude comparison with modern state of the art (SOA) non-volatile memory (Flash, "lance" or PCM-nanowire), and a longer-term exotic alternative (NEMS) switch. The nanotube-PCM switch is expected to have the lowest transition energy & speed, and low voltage compatible with logic circuits. Simulations indicate a trade-off between the on/off ratio and the switching energy, which can be adjusted by engineering the phase-change material composition (depending on the application)
Figure 15:
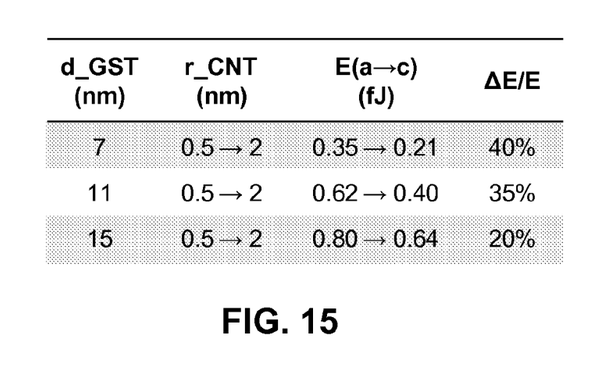
FIG. 15 depicts an illustrative embodiment of results of a computational study of the magnitude (E(a→c)) and variability (ΔE) in bit crystallization energy for a range of GST film thicknesses (d_GST) and nanotube radii (r_CNT). Thicker GST mid-layer increases the switching energy, but minimizes the impact of nanotube diameter variation over a relatively wide range.

Simulation work, summarized in FIG. 15, shows that the choice of sputtered GST thickness (which is more easily controllable) can minimize the effect of intrinsic variation in nanotube diameters. In addition, varying the GST stoichiometry and properties can also be achieved through co-sputtering. FIG. 13 contains a summary of how a nanotube-PCM memory such as described in the present disclosure compares to commercial memories such as Flash memories, PCM memories without nanotubes, and Nano-Electro-Mechanical Systems (NEMS).

Upon reviewing the aforementioned embodiments, it would be evident to an artisan with ordinary skill in the art that said embodiments can be modified, reduced, or enhanced without departing from the scope and spirit of the claims described below. For example, inn an illustrative embodiment, the present disclosure can be utilized as a non-volatile memory for fast, portable devices with large amounts of on-board data storage. This implies, for example, mobile phones holding terabytes of data. Or, laptops with "instant-on" capability, as such memory could replace magnetic hard drives. These applications are naturally fit for military use as well, with the additional benefit of extreme robustness (no moving parts), radiation hardness, low weight, and excellent battery life, for weeks of continuous operation on the battle-field or other extreme conditions.

In another illustrative embodiment, the present disclosure can be utilized as a selection switch providing power, access or control to a variety of electronic components, which need to be occasionally turned off to save system power. The present disclosure can be applied to an array of parallel switches, depending on the current source/sink requirements. In this embodiment, more care must be exercised in selecting the phase-change material layer to maximize its on/off resistivity ratio. One is not limited to $Ge_2Sb_2Te_5$ (GST) in such a design, and different properties may be achieved by co-sputtering, and changing stoichiometry.

In yet another illustrative embodiment, the present disclosure can be utilized as an optically writable but electrically readable memory (or vice-versa), which is particularly unique to this configuration. Carbon nanotubes are known to be very good infrared absorbers, and thus a signal of the correct intensity and polarization may be used to address only certain rows of the nanotube-PCM array (by local heating and phase-change). While this application may preclude single-bit addressability, it can find usage in RFID-like identification or tagging, particularly if combined with flexible substrates that the nanotube-PCM arrays can be transferred onto [4]. In addition, the phase-change material composition may be tailored to a specific crystallization temperature, enabling (or disabling) a secure mass-erase operation by simply exposing the tag to a slightly elevated temperature.

Other suitable modifications can be applied to the present disclosure without departing from the scope of the claims below. Accordingly, the reader is directed to the claims section for a fuller understanding of the breadth and scope of the present disclosure.

Figure 12:
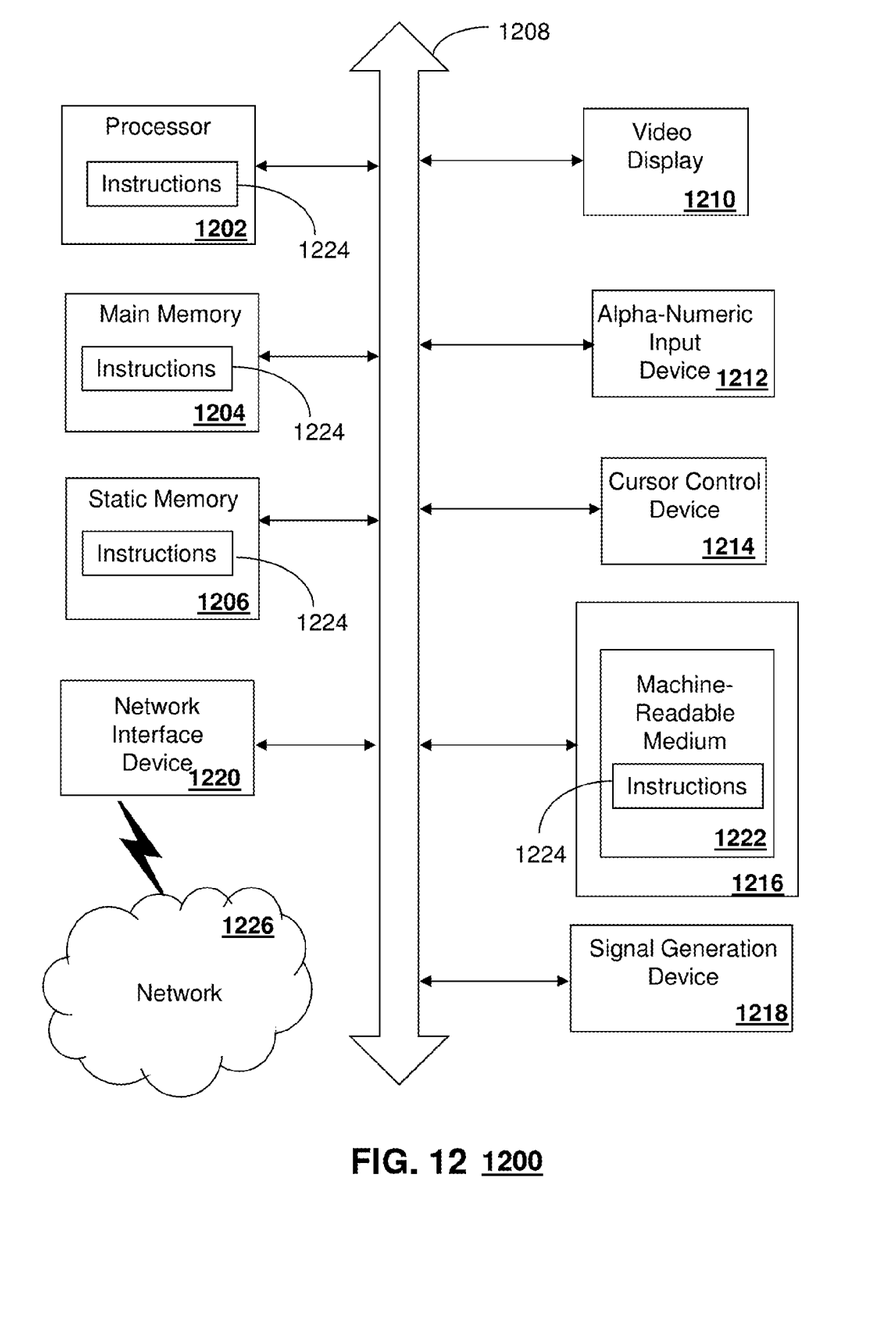
FIG. 12 depicts an exemplary diagrammatic representation of a machine in the form of a computer system within which a set of instructions, when executed, may cause the machine to perform any one or more of the methodologies disclosed herein.

FIG. 12 depicts an exemplary diagrammatic representation of a machine in the form of a computer system 1200 within which a set of instructions can be stored in one or more memory arrays utilizing the principles described in the present disclosure. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 1200 may include a processor 1202 (e.g., a central processing unit (CPU), a graphics processing unit (GPU, or both), a main memory 1204 and a static memory 1206, which communicate with each other via a bus 1208. The computer system 1200 may further include a video display unit 1210 (e.g., a liquid crystal display (LCD), a flat panel, a solid state display, or a cathode ray tube (CRT)). The computer system 1200 may include an input device 1212 (e.g., a keyboard), a cursor control device 1214 (e.g., a mouse), a mass storage device 1216, a signal generation device 1218 (e.g., a speaker or remote control) and a network interface device 1220.

The mass storage device 1216 may include a machine-readable medium 1222 on which is stored one or more sets of instructions (e.g., software 1224). The mass storage medium can embody any one or more of the methodologies or functions described herein, including those methods illustrated above. The instructions 1224 may also reside, completely or at least partially, within the main memory 1204, the static memory 1206, and/or within the processor 1202 during execution thereof by the computer system 1200. The main memory 1204 and the processor 1202 also may constitute machine-readable media with storage means embodying any one or more of the methodologies or functions described herein, including those methods illustrated above.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 1224, or that which receives and executes instructions 1224 from a propagated signal so that a device connected to a network environment 1226 can send or receive voice, video or data, and to communicate over the network 1226 using the instructions 1224. The instructions 1224 may further be transmitted or received over a network 1226 via the network interface device 1220.

While the machine-readable medium 1222 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to embody any one or more of the methodologies or functions described herein, including those methods illustrated above capable of storing, encoding or carrying a set of instructions for execution by the machine and that cause the machine to perform any one or more of the methodologies of the present disclosure. Accordingly, the disclosure is considered to include any one or more of a machine-readable medium or a distribution medium, as described herein and including art-recognized equivalents and successor media, in which the software implementations herein are stored.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

REFERENCES

[1] S. Kang, C. Kocabas, H. Kim, Q. Cao, M. Meitl, J. Rogers, *Nano Lett.* 7, 3343 (2007).
[2] M. Lankhorst, B. Ketelaars, R. Wolters, *Nature Mat.* 4, 347 (2005).
[3] A. L. Lacaita, *Solid-State Elec.* 50, 24 (2006).
[4] R. Bez and P. Cappelletti, *IEEE VLSI* (2005).
[5] F. Pellizzer et al., *IEEE VLSI* (2006).
[6] S.-H. Lee, Y. Jung, R. Agarwal, *Nature Nano.* 2, 626 (2007).
[7] J. E. Jang et al., *Nature Nano.* 3, 26 (2008).
[8] M. Dequesnes et al., *Nanotechnology* 13, 120 (2002).
[9] International Technology Roadmap for Semiconductors (ITRS) Emerging Devices, http://www.itrs.net

[10] E. Pop, D. Mann, K. Goodson, H. Dai, *J. Appl. Phys.* 101, 093710 (2007).
[11] S. Raoux et al., *EPCOS* 2006.
[12] J. Reifenberg et al., *Appl. Phys. Lett.* 91, 111904, (2007).
[13] E. Pop et al., *Nano Lett.* 6, 96 (2006).
[14] X. Wang, L. Zhang, Y. Lu, Y. Kato, H. Dai, E. Pop, *Appl. Phys. Lett.* 91, 261102, (2007).

What is claimed is:

1. A device, comprising:
a first nanotube having a first orientation;
a second nanotube having a second orientation; and
a layer of state changing material disposed between the first nanotube and the second nanotube, wherein the first orientation of the first nanotube and the second orientation of the second nanotube results in an intersecting area between the first nanotube and the second nanotube, wherein the layer of state changing material disposed between the first and second nanotubes extends beyond the intersecting area between the first and the second nanotubes, wherein a first portion of the state changing material disposed in the intersecting area changes state responsive to an electrical signal applied to at least one of the first nanotube, the second nanotube or both, and wherein a second portion of the layer of state changing material extending beyond the intersecting area does not change state responsive to the electrical signal.

2. The device of claim 1, wherein the state changing material comprises first and second surfaces, and wherein the first nanotube is coupled to the first surface of the state changing material, and wherein the second nanotube is coupled to the second surface of the state changing material.

3. The device of claim 2, wherein the electrical signal comprises first and second electrical signals, and wherein the state changing material disposed in the intersecting area changes resistivity in response to the first electrical signal applied to the first nanotube and the second electrical signal applied to the second nanotube.

4. The device of the claim 3, wherein the change in resistivity of the state changing material represents at least one of a plurality of memory states, a plurality of resistive states, or a plurality of switching states.

5. The device of claim 1, wherein the first and second nanotubes are conductive nanotubes.

6. The device of claim 5, wherein the conductive nanotubes comprise semiconducting nanotubes coupled to a back-plane that controls a conductivity of the semiconducting nanotubes.

7. The device of claim 1, wherein the first and second nanotubes have at least one wall.

8. The device of claim 1, wherein the state changing material is a phase-change material.

9. The device of claim 8, wherein the phase-change material comprises at least one of $Ge_2Sb_2Te_5$, $Sb_2Te_3$, GeTe or AsTe.

10. The device of claim 1, wherein the device comprises one of a memory device or a switching device, and wherein the first and the second orientations of the first and second nanotubes are such that the first and second nanotubes are not parallel to each other.

11. The device of claim 10, wherein the memory device is a non-volatile memory.

12. A memory cell, comprising:
a first nanotube;
a second nanotube; and
a layer of state changing material disposed between the first and the second nanotubes, wherein a first orientation of the first nanotube and a second orientation of the second nanotube results in an intersecting area in which a first portion of the state changing material is disposed in the intersecting area, wherein the layer of state changing material disposed between the first and second nanotubes extends beyond the intersecting area between the first and the second nanotubes, wherein the first portion of the state changing material disposed in the intersecting area changes state responsive to an electrical signal applied to one of the first nanotube, the second nanotube, or both, and wherein a remaining portion of the state changing material extending beyond the intersecting area does not change state responsive to the electrical signal.

13. The memory cell of claim 12, wherein at least one of the first or the second nanotubes applies heat to the state changing material in the first portion of the state changing material disposed in the intersecting area thereby changing a state of the state changing material in the first portion responsive to the electrical signal being applied to one of the first nanotube, the second nanotube, or both.

14. The memory cell of claim 13, wherein the change in state is representative of at least one of a plurality of memory states, a plurality of resistive states, a plurality of switching states, or any combination thereof.

15. The memory cell of claim 12, wherein one of the first or the second nanotubes is conductive, and wherein the state changing material comprises a phase-change material.

16. The memory cell of claim 12, wherein the state changing material comprises at least one of $Ge_2Sb_2Te_5$, $Sb_2Te_3$, GeTe or AsTe.

17. A memory array, comprising
a first array of nanotubes;
a second array of nanotubes; and
a state changing material disposed between the first and second array of nanotubes, wherein a first orientation of the first array of nanotubes and a second orientation of the second array of nanotubes results in a plurality of intersecting areas, wherein the state changing material disposed between the first and second array of nanotubes extends beyond the plurality of intersecting areas of the first and second array of nanotubes, wherein portions of the state changing material disposed in the plurality of intersecting areas are memory cells of the memory array, wherein a first portion of the state changing material disposed in the plurality of intersecting areas changes state responsive to at least one electrical signal applied to one of the first array of nanotubes, the second array of nanotubes, or both, and wherein a second portion of the state changing material extending beyond the plurality of intersecting areas does not change state responsive to the electrical signal.

18. The memory array of claim 17, comprising at least one decoder coupled to the first and second arrays of nanotubes to perform read and write operations.

19. The memory array of claim 18, wherein the at least one decoder comprises at least one sensor for detecting resistivity during a read operation.

20. The memory array of claim 17, wherein the state changing material comprises a phase-change material.

* * * * *